(12) United States Patent
Niki

(10) Patent No.: US 9,935,619 B2
(45) Date of Patent: Apr. 3, 2018

(54) SEMICONDUCTOR DEVICE AND COMMUNICATION MODULE

(71) Applicant: KABUSHIKI KAISHA TOSHIBA, Minato-ku, Tokyo (JP)

(72) Inventor: Yusuke Niki, Tokyo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/252,940

(22) Filed: Aug. 31, 2016

(65) Prior Publication Data

US 2017/0237416 A1 Aug. 17, 2017

(30) Foreign Application Priority Data

Feb. 17, 2016 (JP) .................. 2016-028224

(51) Int. Cl.
*H03K 5/04* (2006.01)
*H03K 19/20* (2006.01)
*H03K 5/24* (2006.01)

(52) U.S. Cl.
CPC .............. *H03K 5/04* (2013.01); *H03K 5/24* (2013.01); *H03K 19/20* (2013.01)

(58) Field of Classification Search
USPC .......................................... 327/170, 172–175
See application file for complete search history.

(56) References Cited

U.S. PATENT DOCUMENTS

| 4,700,057 | A * | 10/1987 | Sakai ................. G11B 7/126 250/205 |
| 6,903,589 | B2 * | 6/2005 | Kim .................. H03K 17/166 327/108 |
| 7,772,901 | B2 * | 8/2010 | Chang ................... H03K 5/04 327/170 |
| 8,638,149 | B1 * | 1/2014 | Kossel ............ H03K 19/00361 327/108 |

* cited by examiner

*Primary Examiner* — An Luu
(74) *Attorney, Agent, or Firm* — Foley & Lardner LLP

(57) ABSTRACT

A semiconductor device includes an amplifier, a slew rate regulating circuit, a detection circuit, and a control circuit. The amplifier is configured to amplify an input signal. The slew rate regulating circuit is configured to regulate the slew rate of the input signal. The detection circuit is configured to detect the slew rate of the input signal along a signal path of the input signal between the slew rate regulating circuit and the amplifier. The control circuit is configured to control the slew rate regulating circuit based on a detection result of the detection circuit.

10 Claims, 5 Drawing Sheets

· RISING SLEW RATE $SR1 = V/t1$

· FALLING SLEW RATE $SR2 = V/t2$

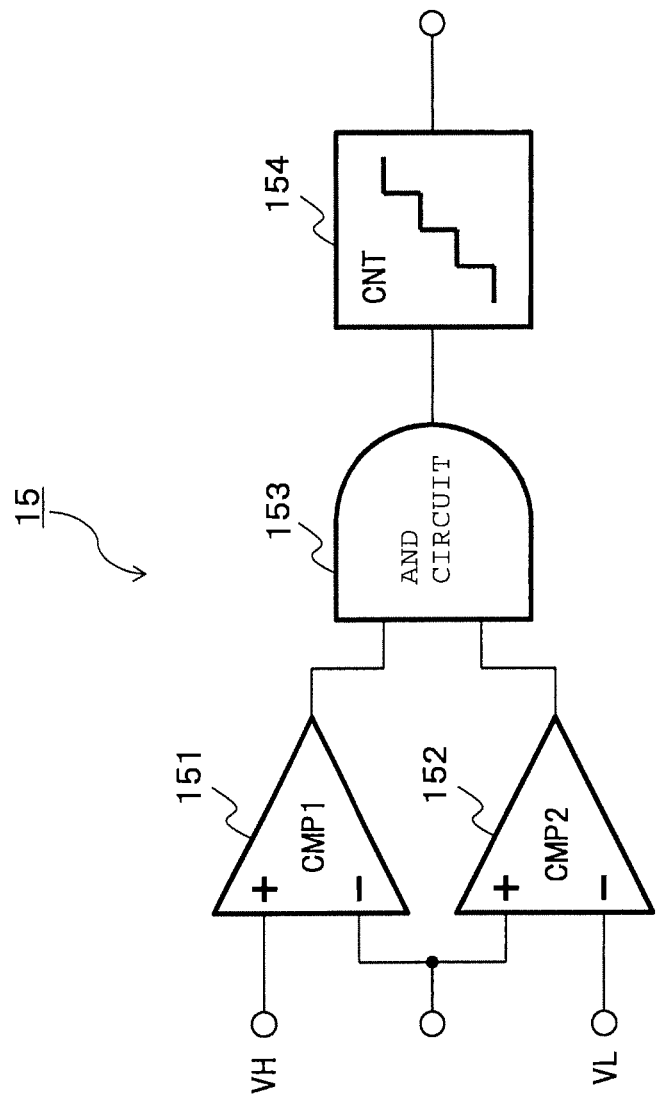

SEMICONDUCTOR DEVICE AND COMMUNICATION MODULE

CROSS-REFERENCE TO RELATED APPLICATION

This application claims the benefit of and priority to Japanese Patent Application No. 2016-028224, filed Feb. 17, 2016; the entire contents of which are incorporated herein by reference.

FIELD

Embodiments described herein relate generally to semiconductor devices and communication modules.

BACKGROUND

A communication module which is used in radio communication includes, for example, a power amplifier, an impedance matching circuit, and so forth. In this power amplifier, a nonlinear power amplifier is usually used. Since the nonlinear power amplifier uses a rectangular wave signal, the power efficiency thereof is generally higher than the power efficiency of a linear power amplifier using a sinusoidal signal.

On the other hand, an output signal of the nonlinear power amplifier contains many harmonic components. In order to remove these harmonic components, a high-performance external filter is generally used; however, the filter occupies a large space in the communication module.

SUMMARY

In some embodiments according to one aspect, a semiconductor device includes an amplifier, a slew rate regulating circuit, a detection circuit, and a control circuit. The amplifier is configured to amplify an input signal. The slew rate regulating circuit is configured to regulate the slew rate of the input signal. The detection circuit is configured to detect the slew rate of the input signal along a signal path of the input signal between the slew rate regulating circuit and the amplifier. The control circuit is configured to control the slew rate regulating circuit based on a detection result of the detection circuit.

In some embodiments according to another aspect, a communication module includes an amplifier, a slew rate regulating circuit, a detection circuit, a control circuit, and a matching circuit. The amplifier is configured to amplify an input signal. The slew rate regulating circuit is configured to regulate the slew rate of the input signal. The detection circuit is configured to detect the slew rate of the input signal at a point along a signal path of the input signal between the slew rate regulating circuit and the amplifier. The control circuit is configured to control the slew rate regulating circuit based on a detection result of the detection circuit. The matching circuit is configured to match an impedance of the signal amplified by the amplifier with a reference impedance.

Other aspects and embodiments of the disclosure are also encompassed. The foregoing summary and the following detailed description are not meant to restrict the disclosure to any particular embodiment but are merely meant to describe some embodiments of the disclosure.

BRIEF DESCRIPTION OF THE DRAWINGS

FIG. 6 is a circuit diagram depicting an example of a detection circuit.

DETAILED DESCRIPTION

Example embodiments provide a semiconductor device and a communication module which can reduce harmonic components without increasing a size thereof.

In general, according to some embodiments, a semiconductor device includes an amplifier, a slew rate regulating circuit, a detection circuit, and a control circuit. The amplifier amplifies an input signal. The slew rate regulating circuit regulates a slew rate of the input signal. The detection circuit detects the slew rate of the input signal between the slew rate regulating circuit and the amplifier. The control circuit controls the slew rate regulating circuit based on a detection result of the detection circuit.

Hereinafter, an example embodiment will be described with reference to the drawings. This embodiment is not meant to be restricted.

Figure 1:
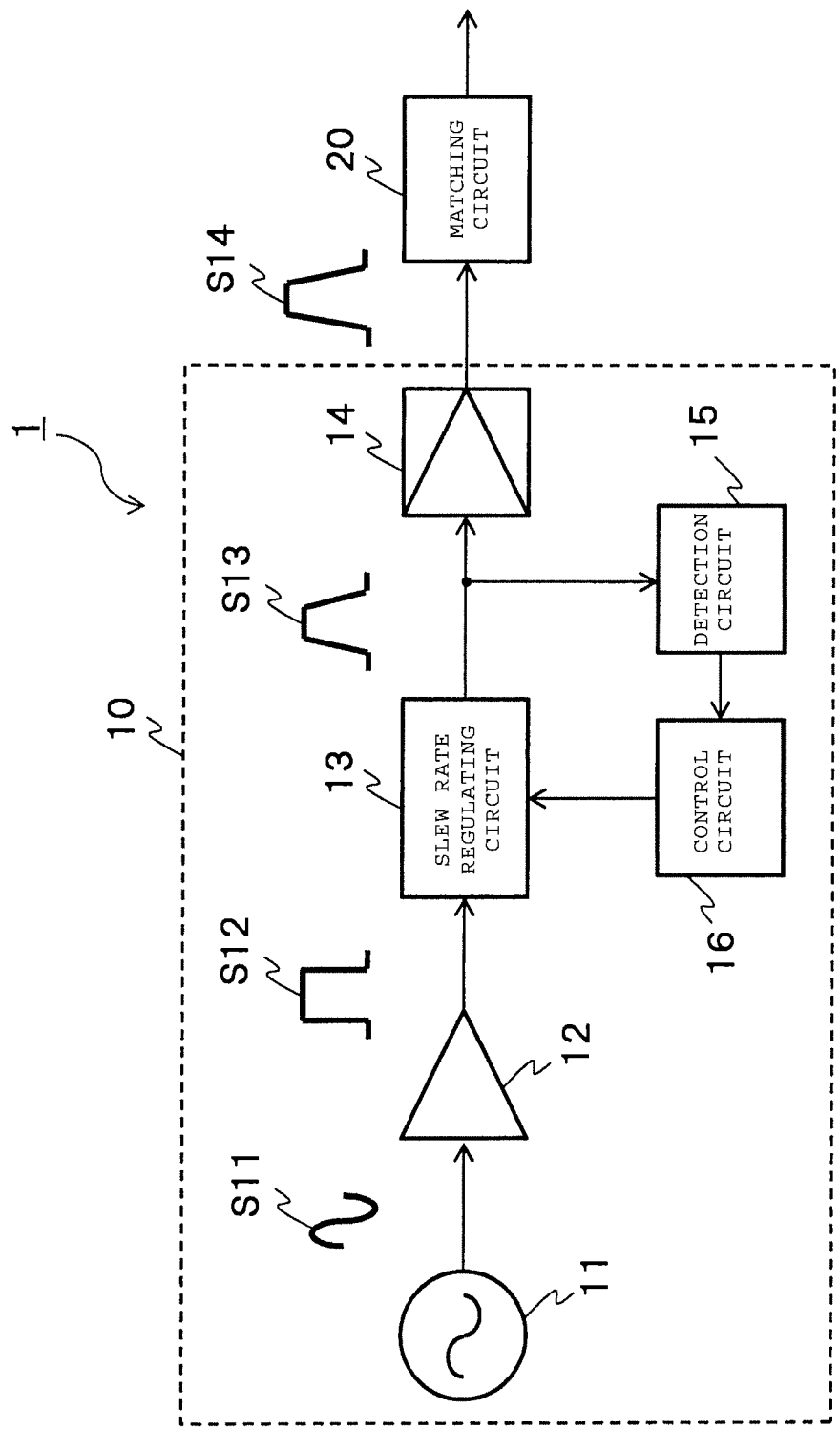
FIG. 1 is a block diagram depicting the configuration of a communication module according to an embodiment.

FIG. 1 is a block diagram depicting the configuration of a communication module according to the embodiment. As depicted in FIG. 1, a communication module 1 according to this embodiment includes a semiconductor device 10 and a matching circuit 20. Furthermore, the semiconductor device 10 includes an oscillator 11, a buffer circuit 12, a slew rate regulating circuit 13, an amplifier 14, a detection circuit 15, and a control circuit 16. The semiconductor device 10 can usually be provided in one semiconductor chip.

By making use of a high correlation of harmonic components between an input and output of the amplifier 14, harmonic components that are contained in an input signal of the amplifier 14 can be reduced so as to reduce the harmonic components in an output signal. In such a way, a slew rate and a pulse width of a signal, which the amplifier 14 receives, can be optimized.

In the depicted embodiment, the oscillator 11 generates an oscillation signal S11 and outputs the generated oscillation signal S11 to the buffer circuit 12. The oscillator 11 can include a phase-locked loop ("PLL") circuit that performs feedback control in such a way that the phase of the oscillation signal S11 is synchronized to the phase of a reference signal, for example.

The buffer circuit 12 converts the oscillation signal S11 from the oscillator 11 into a rectangular wave signal S12. Then, the buffer circuit 12 outputs the rectangular wave signal S12 to the slew rate regulating circuit 13.

The slew rate regulating circuit 13 generates a trapezoidal wave signal S13 based on the rectangular wave signal S12 from the buffer circuit 12 and outputs the generated trapezoidal wave signal S13 to the amplifier 14. At this time, based on the control of the control circuit 16, the slew rate regulating circuit 13 regulates the slew rate of the trapezoidal wave signal S13. Here, the slew rate will be described with reference to FIG. 2.

Figure 2:
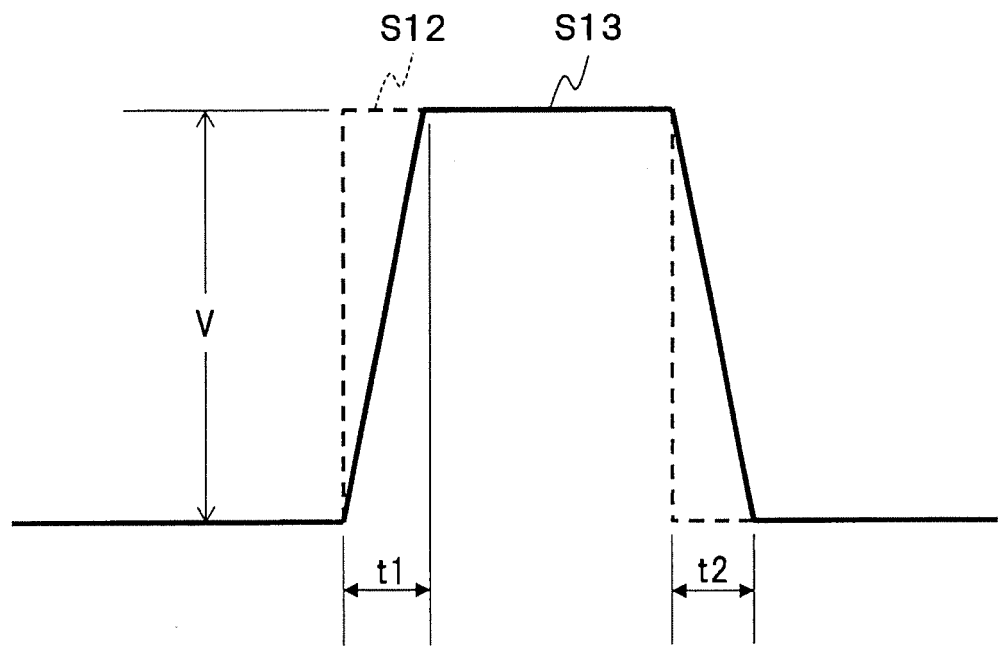
FIG. 2 is a diagram for explaining a slew rate.

FIG. 2 is a diagram for explaining the slew rate. As depicted in FIG. 2, a slew rate can refer to a rising slew rate SR1 or a falling slew rate SR2. The rising slew rate SR1 is a value that can be obtained by dividing a predetermined voltage V by a rising time t1. On the other hand, the falling slew rate SR2 is a value that can be obtained by dividing the voltage V by a falling time t2.

Figure 3:
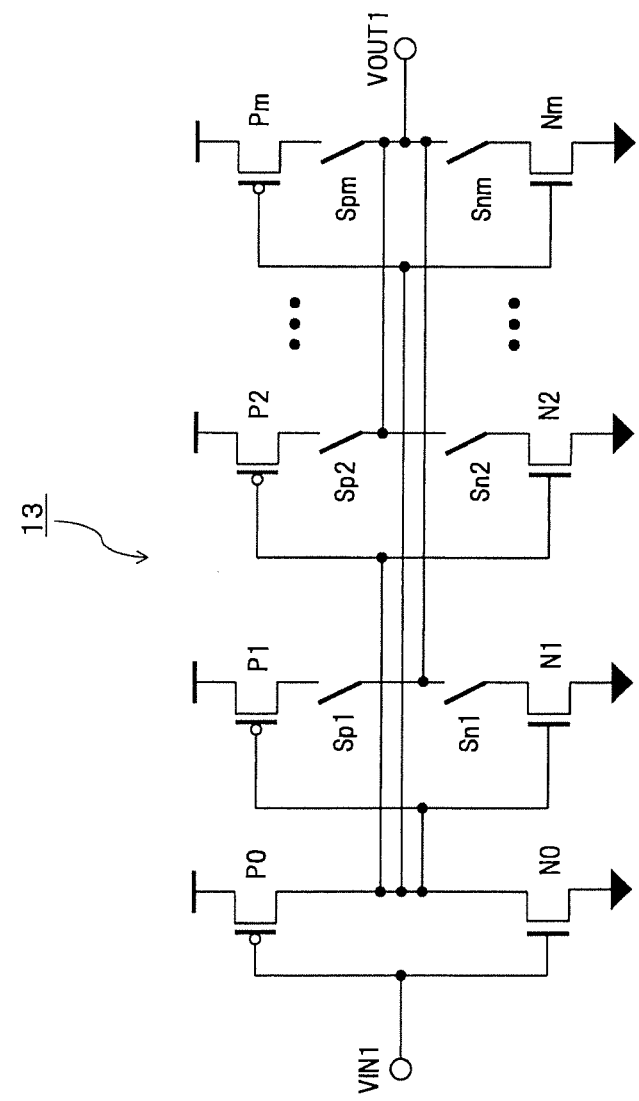
FIG. 3 is a circuit diagram depicting an example of a slew rate regulating circuit.

FIG. 3 is a circuit diagram depicting an example of the slew rate regulating circuit 13. As depicted in FIG. 3, the slew rate regulating circuit 13 includes a first P-type MOS transistor P0, a first N-type MOS transistor N0, a plurality of second P-type MOS transistors P1 to Pm, a plurality of second N-type MOS transistors N1 to Nm, a plurality of first switches Sp1 to Spm, a plurality of second switches Sn1 to Snm, an input terminal VIN1, and an output terminal VOUT1. It is noted that in some cases, a single second P-type MOS transistor, a single second N-type MOS transistor, a single first switch, and a single second switch may be provided.

The first P-type MOS transistor P0 and the first N-type MOS transistor N0 are connected in series. Moreover, a source of the first P-type MOS transistor P0 is connected to a power supply, and a source of the first N-type MOS transistor N0 is grounded. Furthermore, a gate of the first P-type MOS transistor P0 and a gate of the first N-type MOS transistor N0 are connected to the input terminal VIN1.

Gates of the second P-type MOS transistors P1 to Pm are connected to a drain of the first P-type MOS transistor P0 (which is also connected to a drain of the first N-type MOS transistor N0). Moreover, sources of the second P-type MOS transistors P1 to Pm are connected to the power supply.

Gates of the second N-type MOS transistors N1 to Nm are also connected to the drain of the first P-type MOS transistor P0 (and to the drain of the first N-type MOS transistor N0). Moreover, sources of the second N-type MOS transistors N1 to Nm are grounded.

The first switches Sp1 to Spm are connected in series to the second P-type MOS transistors P1 to Pm, respectively. The first switches Sp1 to Spm are each configured with a P-type MOS transistor that is switched to an ON state and an OFF state based on the control of the control circuit 16, for example. When the first switches Sp1 to Spm are in the ON state, the second P-type MOS transistors P1 to Pm are electrically connected to the output terminal VOUT1. At this time, if the second P-type MOS transistors P1 to Pm are in the ON state, the second P-type MOS transistors P1 to Pm raise a voltage of the output terminal VOUT1 to a same level as the voltage of the power supply.

The second switches Sn1 to Snm are connected in series to the second P-type MOS transistors P1 to Pm, respectively, through the first switches Sp1 to Spm. The second switches Sn1 to Snm are each configured with an N-type MOS transistor that is switched to an ON state and an OFF state based on the control of the control circuit 16, for example. When the second switches Sn1 to Snm are in the ON state, the second N-type MOS transistors N1 to Nm are electrically connected to the output terminal VOUT1. At this time, if the second N-type MOS transistors N1 to Nm are in the ON state, the second N-type MOS transistors N1 to Nm lower the voltage of the output terminal VOUT1 to a ground level (e.g. 0 V).

With the slew rate regulating circuit 13 configured as described above, when the rectangular wave signal S12 is input to the input terminal VIN1, the trapezoidal wave signal S13 is output from the output terminal VOUT1. In the slew rate regulating circuit 13, in accordance with the voltage level of the rectangular wave signal S12, the ON state and the OFF state of the first P-type MOS transistor P0 and the first N-type MOS transistor N0 are switched.

Moreover, based on the number of first switches Sp1 to Spm in the ON state and the number of second switches Sn1 to Snm in the ON state, the number of second P-type MOS transistors P1 to Pm connected to the output terminal VOUT1 is correspondingly changed, and the number of second N-type MOS transistors N1 to Nm connected to the output terminal VOUT1 is also correspondingly changed. In accordance with these changes, the rising time t1 and the falling time t2 of the trapezoidal wave signal S13 change. As a result, the rising slew rate SR1 and the falling slew rate SR2 of the trapezoidal wave signal S13 are regulated.

The amplifier 14 amplifies the trapezoidal wave signal S13 input from the slew rate regulating circuit 13 and outputs an amplification signal S14 to the matching circuit 20. In this embodiment, the trapezoidal wave signal S13 corresponds to the input signal of the amplifier 14. Hereinafter, with reference to FIGS. 4 and 5, the configuration of the amplifier 14 will be described.

Figure 4:
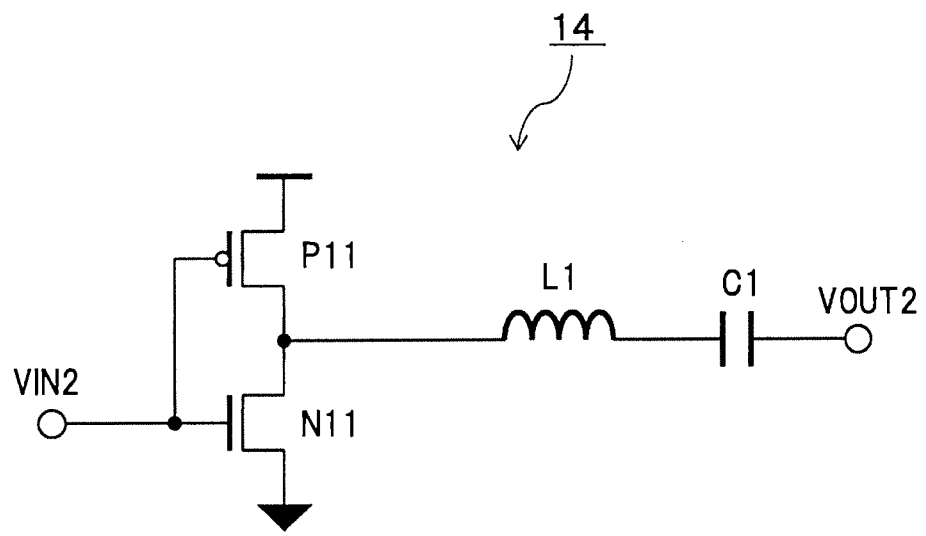
FIG. 4 is a circuit diagram depicting an example of an amplifier.

FIG. 4 is a circuit diagram depicting an example of the amplifier. The amplifier 14 depicted in FIG. 4 is a so-called Class-D power amplifier. Specifically, this amplifier 14 includes a P-type MOS transistor P11, an N-type MOS transistor N11, an inductor L1, a capacitor C1, an input terminal VIN2, and an output terminal VOUT2.

The P-type MOS transistor P11 and the N-type MOS transistor N11 are connected in series. Moreover, a source of the P-type MOS transistor P11 is connected to a power supply, and a source of the N-type MOS transistor N11 is grounded. Furthermore, a gate of the P-type MOS transistor P11 and a gate of the N-type MOS transistor N11 are connected to the input terminal VIN2.

One end of the inductor L1 is connected to a drain of the P-type MOS transistor P11 (and to a drain of the N-type MOS transistor N11). Another end of the inductor L1 is connected to the output terminal VOUT2 via the capacitor C1.

With the above-described amplifier 14, when the trapezoidal wave signal S13 is input to the input terminal VIN2, the amplification signal S14 is output from the output terminal VOUT2. At this time, in accordance with the voltage level of the trapezoidal wave signal S13, the ON state and the OFF state of the P-type MOS transistor P11 and the N-type MOS transistor N11 are switched. By such a switching operation, and through operation of the inductor L1 and the capacitor C1, the amplification signal S14 is generated and output from the output terminal VOUT2.

Figure 5:
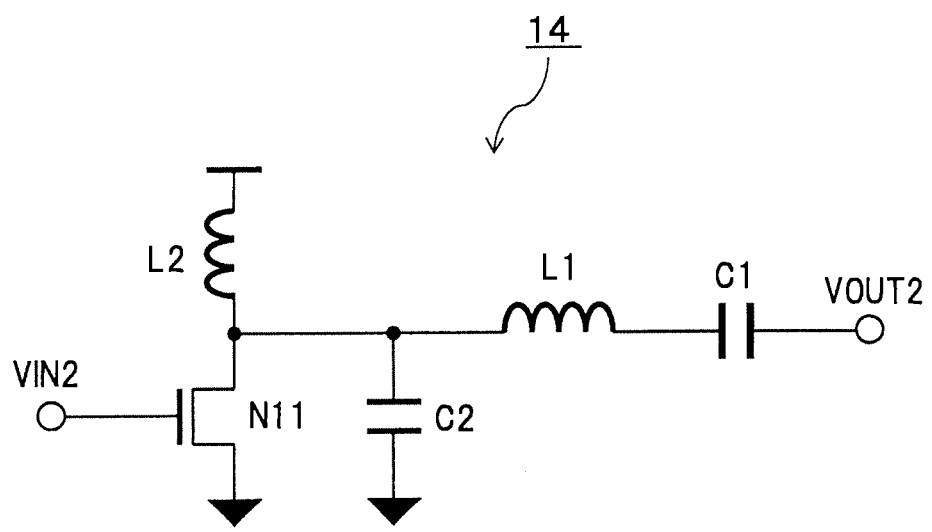
FIG. 5 is a circuit diagram depicting another example of the amplifier.

FIG. 5 is a circuit diagram depicting another example of the amplifier. The amplifier 14 depicted in FIG. 5 is a so-called Class-E power amplifier. Specifically, this amplifier 14 has an N-type MOS transistor N11, inductors L1 and L2, capacitors C1 and C2, an input terminal VIN2, and an output terminal VOUT2. Since the N-type MOS transistor N11, the inductor L1, and the capacitor C1 have the same configurations as those of the above-described amplifier 14, explanations thereof are omitted.

One end of the inductor L2 is connected to a power supply, and the other end thereof is connected to a drain of the N-type MOS transistor N1. Moreover, the capacitor C2 is connected in parallel to the N-type MOS transistor N11.

With the above-described amplifier 14, when the trapezoidal wave signal S13 is input to the input terminal VIN2, the amplification signal S14 is output from the output terminal VOUT2. At this time, a current is supplied to the N-type MOS transistor N11 via the inductor L2 so that the ON state and the OFF state of the N-type MOS transistor N11 are switched in accordance with the voltage level of the trapezoidal wave signal S13. By such a switching operation, and through operation of the inductor L1 and the capacitors C1 and C2, the amplification signal S14 is generated and output from the output terminal VOUT2.

The detection circuit 15 detects the slew rate of the trapezoidal wave signal S13. Hereinafter, the configuration of the detection circuit 15 will be described with reference to FIG. 6.

FIG. 6 is a circuit diagram depicting an example of the detection circuit 15. As depicted in FIG. 6, the detection circuit 15 has a first comparator 151 (CMP1), a second comparator 152 (CMP2), an AND circuit 153, and a counter circuit 154 (CNT).

The first comparator 151 compares the voltage of the trapezoidal wave signal S13 with a first voltage VH. The trapezoidal wave signal S13 is input to an inverting input terminal (−) of the first comparator 151. The first voltage VH is input to a non-inverting input terminal (+) of the first comparator 151.

The second comparator 152 compares the voltage of the trapezoidal wave signal S13 with a second voltage VL. This second voltage VL is lower than the first voltage VH. The trapezoidal wave signal S13 is input to a non-inverting input terminal (+) of the second comparator 152. The second voltage VL is input to an inverting input terminal (−) of the second comparator 152.

A comparison result of the first comparator 151 and a comparison result of the second comparator 152 are input to the AND circuit 153. Based on the comparison result of the first comparator 151, the AND circuit 153 detects whether the voltage of the trapezoidal wave signal S13 is lower than the first voltage VH. Furthermore, based on the comparison result of the second comparator 152, the AND circuit 153 detects whether the voltage of the trapezoidal wave signal S13 is higher than the second voltage VL. This allows the AND circuit 153 to detect that the voltage of the trapezoidal wave signal S13 is changing, in other words, that a rising edge or a falling edge of the trapezoidal wave signal S13 is being measured. For example, if the AND circuit 153 detects that the voltage of the trapezoidal wave signal 13 is lower than the first voltage VH which corresponds to a maximum voltage of the trapezoidal wave signal S13, and that the voltage of the trapezoidal wave signal 13 is higher than the second voltage VL which corresponds to a minimum voltage of the trapezoidal wave signal S13, the AND circuit 153 can detect or can determine that a rising or falling edge is being measured, and that a voltage of the trapezoidal wave signal S13 is changing.

Based on the detection result of the AND circuit 153, the counter circuit 154 measures the time for which the voltage of the trapezoidal wave signal S13 is changing. This time corresponds to the rising time t1 and the falling time t2. Then, the counter circuit 154 outputs the measurement result to the control circuit 16.

Based on the measurement result of the counter circuit 154, the control circuit 16 controls the first switches Sp1 to Spm and the second switches Sn1 to Snm of the slew rate regulating circuit 13. Specifically, the control circuit 16 includes a logic circuit in which a state of the first switches Sp1 to Spm and a state of the second switches Sn1 to Snm are set in accordance with the rising time t1 and the falling time t2. The control circuit 16 optimizes the slew rate and/or the pulse width of the trapezoidal wave signal S13 which is input to the amplifier 14 by controlling the first switches Sp1 to Spm and the second switches Sn1 to Snm.

For example, if the rising slew rate SR1 is to be increased and the falling slew rate SR2 is to be decreased based on a measurement result, the control circuit 16 can increase the number of first switches Sp1 to Spm in the ON state and/or reduce the number of second switches Sn1 to Snm in the ON state.

By the above-described control, the number of second P-type MOS transistors P1 to Pm in the ON state can be increased and/or the number of second N-type MOS transistors N1 to Nm in the ON state can be reduced. As a result, the rising time t1 is shortened and the falling time t2 is extended and therefore the rising slew rate SR1 is increased and the falling slew rate SR2 is decreased.

Conversely, if the rising slew rate SR1 is to be decreased and the falling slew rate SR2 is to be increased based on a measurement result, the control circuit 16 can reduce the number of first switches Sp1 to Spm in the ON state and/or can increase the number of second switches Sn1 to Snm in the ON state.

By the above-described control, the number of second P-type MOS transistors P1 to Pm in the ON state can be reduced and the number of second N-type MOS transistors N1 to Nm in the ON state can be increased. As a result, the rising time t1 is extended and the falling time t2 is shortened and therefore the rising slew rate SR1 is decreased and the falling slew rate SR2 is increased.

The matching circuit 20 matches the impedance of the amplification signal S14 output from the amplifier 14 with a reference impedance. The reference impedance can be any appropriate impedance, for example, a predetermined impedance of 50Ω. At the same time, the amplification signal S14 can be converted into a sinusoidal signal.

In the depicted embodiment, the detection circuit 15 detects the slew rate of the trapezoidal wave signal S13 which is the input signal of the amplifier 14. Then, based on the detection result of the detection circuit 15, the control circuit 16 controls the slew rate regulating circuit 13, whereby the slew rate of the trapezoidal wave signal S13 is optimized, for example, for suppression of harmonic components. As a result, the harmonic components of the amplification signal S14 which is the output signal of the amplifier 14 can be suppressed.

According to the embodiment described above, components for suppressing harmonic components contained in the output signal of the amplifier 14, that is, the slew rate regulating circuit 13, the detection circuit 15, and the control circuit 16 are provided in the semiconductor device 10. As a result, even when an external filter of the semiconductor device 10 is simplified, the above-described harmonic components are suppressed. Thus, harmonic components contained in the output signal of the amplifier 14 can also be suppressed with an increase in the size of the communication module 1 being suppressed.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A semiconductor device comprising:
an amplifier configured to amplify an input signal;
a slew rate regulating circuit configured to regulate a slew rate of the input signal;

a detection circuit configured to detect the slew rate of the input signal along a signal path of the input signal between the slew rate regulating circuit and the amplifier; and a control circuit configured to control the slew rate regulating circuit based on a detection result of the detection circuit, wherein the detection circuit includes:
   a first comparator configured to compare a voltage of the input signal with a first voltage,
   a second comparator configured to compare the voltage of the input signal with a second voltage which is lower than the first voltage,
   an AND circuit to which a comparison result of the first comparator and a comparison result of the second comparator are input, the AND circuit configured to detect whether the voltage of the input signal is higher than the second voltage and lower than the first voltage, and
   a counter circuit configured to measure a rising time or a falling time of the input signal based on a detection result of the AND circuit and output a measurement result to the control circuit, wherein the slew rate regulating circuit includes:
   a first P-type MOS transistor,
   a first N-type MOS transistor that is connected in series to the first P-type MOS transistor,
   a second P-type MOS transistor including a gate that is connected to a drain of the first P-type MOS transistor,
   a first switch that is connected in series to the second P-type MOS transistor,
   a second switch that is connected in series to the second P-type MOS transistor via the first switch, and
   a second N-type MOS transistor including a gate that is connected to the drain of the first P-type MOS transistor, the second N-type MOS transistor connected in series to the second P-type MOS transistor via the first switch and the second switch, and wherein the control circuit is configured to control the first switch and the second switch based on the measurement result.

2. The semiconductor device according to claim 1, wherein the slew rate regulating circuit includes
   a plurality of second P-type MOS transistors including the second P-type MOS transistor, a plurality of second N-type MOS transistors including the second N-type MOS transistor, a plurality of first switches including the first switch, and a plurality of second switches including the second switch, each of the plurality of second P-type MOS transistors being connected in series to one of the N-type MOS transistors via one of the first switches and one of the second switches.

3. The semiconductor device according to claim 2, wherein
   the control circuit is configured to increase a number of the first switches in an ON state or reduce a number of the second switches in an ON state to shorten the rising time or extend the falling time.

4. The semiconductor device according to claim 2, wherein
   the control circuit is configured to reduce a number of the first switches in an ON state or increase a number of the second switches in an ON state to extend the rising time or shorten the falling time.

5. The semiconductor device according to claim 1, wherein the first switch is formed of a P-type MOS transistor, and the second switch is formed of an N-type MOS transistor.

6. A communication module comprising:
   an amplifier configured to amplify an input signal;
   a slew rate regulating circuit configured to regulate a slew rate of the input signal;
   a detection circuit configured to detect the slew rate of the input signal along a signal path of the input signal between the slew rate regulating circuit and the amplifier;
   a control circuit configured to control the slew rate regulating circuit based on a detection result of the detection circuit; and
   a matching circuit configured to match an impedance of the signal amplified by the amplifier with a reference impedance, wherein the detection circuit includes:
   a first comparator configured to compare a voltage of the input signal with a first voltage,
   a second comparator configured to compare the voltage of the input signal with a second voltage which is lower than the first voltage,
   an AND circuit to which a comparison result of the first comparator and a comparison result of the second comparator are input, the AND circuit configured to detect whether the voltage of the input signal is higher than the second voltage and lower than the first voltage, and
   a counter circuit configured to measure a rising time or a falling time of the input signal based on a detection result of the AND circuit and output a measurement result to the control circuit, wherein the slew rate regulating circuit includes:
   a first P-type MOS transistor,
   a first N-type MOS transistor that is connected in series to the first P-type MOS transistor,
   a second P-type MOS transistor including a gate that is connected to a drain of the first P-type MOS transistor,
   a first switch that is connected in series to the second P-type MOS transistor,
   a second switch that is connected in series to the second P-type MOS transistor via the first switch, and
   a second N-type MOS transistor including a gate that is connected to the drain of the first P-type MOS transistor, the second N-type MOS transistor connected in series to the second P-type MOS transistor via the first switch and the second switch, and wherein the control circuit is configured to control the first switch and the second switch based on the measurement result.

7. The communication module according to claim 6, wherein the slew rate regulating circuit includes
   a plurality of second P-type MOS transistors including the second P-type MOS transistor, a plurality of second N-type MOS transistors including the second N-type MOS transistor, a plurality of first switches including the first switch, and a plurality of second switches including the second switch, each of the plurality of second P-type MOS transistors being connected in series to one of the N-type MOS transistors via one of the first switches and one of the second switches.

8. The communication module according to claim 7, wherein
   the control circuit is configured to increase a number of the first switches in an ON state or reduce a number of the second switches in an ON state to shorten the rising time or lengthen the falling time.

9. The communication module according to claim 7, wherein
the control circuit is configured to reduce a number of the first switches in an ON state or increase a number of the second switches in an ON state to lengthen the rising time and/or shorten the falling time.

10. The communication module according to claim 6, wherein
the first switch is formed of a P-type MOS transistor, and the second switch is formed of an N-type MOS transistor.

* * * * *